United States Patent
Hohmann

(10) Patent No.: US 12,362,745 B2
(45) Date of Patent: Jul. 15, 2025

(54) METHOD FOR DRIVING A TOPOLOGICAL SEMICONDUCTOR SWITCH FOR A POWER ELECTRONICS SYSTEM

(71) Applicant: ZF Friedrichshafen AG, Friedrichshafen (DE)

(72) Inventor: Fabian Hohmann, Hofbieber (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 168 days.

(21) Appl. No.: 18/365,840

(22) Filed: Aug. 4, 2023

(65) Prior Publication Data

US 2024/0048140 A1 Feb. 8, 2024

(30) Foreign Application Priority Data

Aug. 5, 2022 (DE) .................... 102022208169.2

(51) Int. Cl.
*H02M 7/483* (2007.01)
*H02M 7/537* (2006.01)
*H02P 27/06* (2006.01)
*H03K 17/567* (2006.01)

(52) U.S. Cl.
CPC .......... *H03K 17/567* (2013.01); *H02M 7/537* (2013.01); *H02P 27/06* (2013.01)

(58) Field of Classification Search
CPC ...... H02M 7/537; H02M 7/48; H02M 1/0009; H02M 1/088; H02P 27/06; H03K 17/122; H03K 17/127
See application file for complete search history.

(56) References Cited

U.S. PATENT DOCUMENTS

2016/0191046 A1 6/2016 Zhao et al.
2020/0412359 A1* 12/2020 Van Brunt ........... H03K 17/122

FOREIGN PATENT DOCUMENTS

WO WO 2022/106339 A1 3/2022

OTHER PUBLICATIONS

Office Action dated Jun. 29, 2023 for German Patent Application No. 10 2022 208 169.2 (16 pp.), note: pp. 1 and 2 are English language Explanations to Section C. Result of Determination Document.

* cited by examiner

*Primary Examiner* — Muhammad S Islam
(74) *Attorney, Agent, or Firm* — Crowell & Moring LLP

(57) ABSTRACT

A method for driving a topological semiconductor switch for a power electronics system, wherein the topological semiconductor switch is split into at least two groups of power semiconductors that are driven temporally separately from one another at a preset switching frequency in such a way that in each case only one of the power semiconductors takes on the total current, wherein the method includes determining of a next switching point, including conducting a point-wise interpolation of the discretized phase current in such a way that the change in the current between two conducting phases is measured and extrapolated, and then, together with the switching frequency, the current rise and the current error are predicted for the next two switching operations, and from this the next switching point with the smallest absolute current deviation is determined.

13 Claims, 2 Drawing Sheets

METHOD FOR DRIVING A TOPOLOGICAL SEMICONDUCTOR SWITCH FOR A POWER ELECTRONICS SYSTEM

CROSS-REFERENCE TO RELATED APPLICATION

This application claims priority to German Application No. DE 10 2022 208 169.2, filed on Aug. 5, 2022, the entirety of which is hereby fully incorporated by reference herein.

FIELD

The present invention relates to the field of electromobility, in particular electronics modules.

BACKGROUND AND SUMMARY

The use of electronics modules, for example power electronics modules, in motor vehicles has increased significantly in recent decades. This can be attributed firstly to the need to improve the fuel saving and the vehicle performance and secondly to the advances in semiconductor technology.

Inverters, also referred to as power converters, require a power module or a semiconductor package in order that the direct current originating from a battery or the rechargeable battery is converted into alternating current. The power module has topological switches having power transistors which are used for controlling the currents and for generating the alternating current. In this case, different configurations of power transistors are known. It is known, inter alia, to use so-called MOSFETs (metal-oxide-semiconductor field-effect transistors) or IGBTs (insulated-gate bipolar transistors). The semiconductor material used in this case can be silicon (Si), silicon carbide (SiC), gallium nitride (GaN) or any other semiconductor material. The use of different types of semiconductor in a topological semiconductor switch is also already known, for example a combination of SiC-MOSFET and Si-IGBT. In order to operate these in parallel, different drive methods are known, for example an XOR operation in which in each case only one of the semiconductors is active.

Since there is still need for improvement in the driving, the invention is based on an object of providing an improved method for driving a topological semiconductor switch for a power electronics system.

This object is achieved by the features as disclosed herein. Advantageous configurations are also the subject matter of the present disclosure.

What is proposed is a method for driving a topological semiconductor switch for a power electronics system, wherein the topological semiconductor switch is split into at least two groups of power semiconductors which are driven temporally separately from one another at a preset switching frequency in such a way that in each case only one of the power semiconductors takes on the total current, wherein, for determination of a next switching point, a pointwise interpolation of the discretized phase current takes place in such a way that the change in the current between two conducting phases is measured and extrapolated, and then, together with the switching frequency, the current rise and the current error are predicted for the next two switching operations, and from this the next switching point with the smallest absolute current deviation is determined.

In one configuration, provision is made for the extrapolation to be a linear extrapolation or to take place on the basis of a sine-wave modulation.

In one configuration, provision is made for the change in the current to be measured at preset switching points.

In one configuration, provision is made for the switching points to be at the start or at the end or to be mid-synchronously with respect to the conducting phase or for averaging between two switching points to take place.

In one configuration, provision is made for a short-term increase in the switching frequency to take place after determination of the next switching point and for switchover. As a result, the next switching point is met more precisely.

In addition, a power electronics module is proposed having at least one topological semiconductor switch which is split into at least two groups of power semiconductors which are driven temporally separately from one another at a preset switching frequency in such a way that in each case only one of the power semiconductors takes on the total current, wherein the topological semiconductor switch is driven by the above-described method.

In one configuration, provision is made for the power semiconductors in the groups to consist of different semiconductor materials and/or different semiconductor types and/or different semiconductor areas.

In one configuration, provision is made for one of the power semiconductors to be an SiC-MOSFET and the other to be an Si-IGBT.

In addition, an inverter is provided having the power electronics module. In addition, an electric drive of a vehicle is provided, having the inverter. Likewise, a motor vehicle is provided, having an electric motor driven by means of an electric drive.

Further features and advantages of the invention can be gleaned from the description below of exemplary embodiments of the invention, with reference to the figures in the drawing which shows details according to the invention, and from the claims. The individual features can be implemented in each case individually or together in any desired combination in one variant of the invention.

Preferred embodiments of the invention will be explained in more detail below with reference to the attached drawings.

DETAILED DESCRIPTION

In the descriptions of the figures below, identical elements or functions are provided with the same reference signs.

Figure 1:
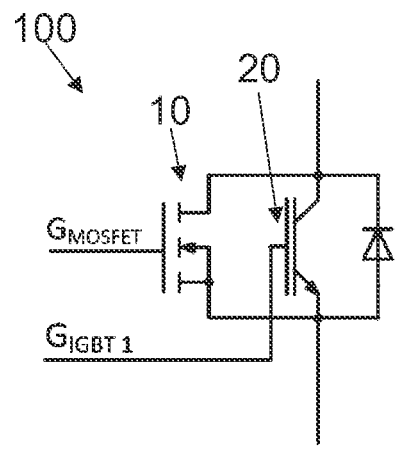
FIG. 1 shows a basic design of a topological semiconductor switch in accordance with one embodiment of the present invention.
Figure 2:
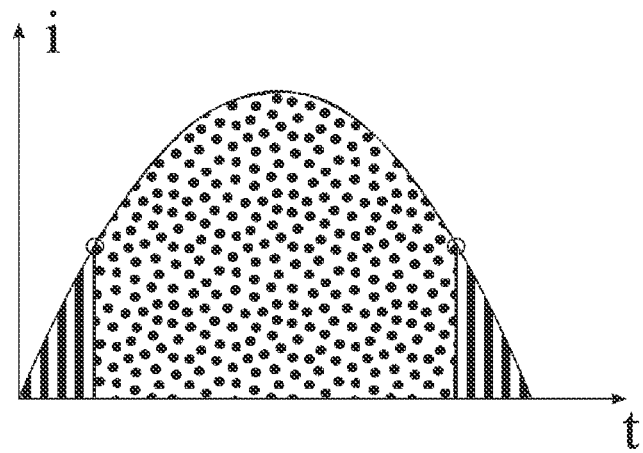
FIG. 2 shows the principle of XOR driving of the topological semiconductor switch shown in FIG. 1.

The parallel operation of topological semiconductor switches of different semiconductor groups, for example a silicon carbide MOSFET 10 and an Si-IGBT 20, as shown in FIG. 1, is possible owing to a plurality of drive methods. A promising method is in this case the temporally separate driving of the semiconductors, so-called XOR driving, as is illustrated in FIG. 2. In this case, in each case only one semiconductor group takes on the total current.

In the striped region, the silicon carbide MOSFET 10 is conducting, whereas the dotted (central) region is taken over by the silicon IGBT 20. The XOR driving enables a plurality of advantages, for example optimized gate resistances, only one current sensor being necessary, etc. Owing to the discretization of the sine wave at the switching frequency, the problem of exact switchover of the semiconductor type at the circled switching points results (FIG. 2).

Figure 3:
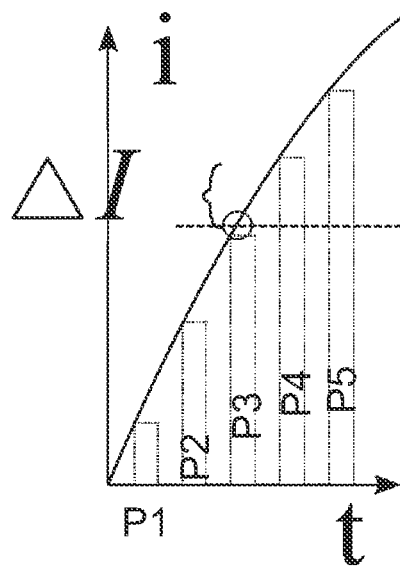
FIG. 3 shows a u-i graph with discretized current and a current error by switchover with current limit in accordance with the prior art.

FIG. 3 shows the discretized phase current. Since the threshold (dotted line) for switchover first needs to be exceeded, a current error ΔI results. The magnitude of the current error ΔI is dependent on a plurality of factors:

- selected switchover time in the sine wave (the steeper the sine wave, the greater the error)
- current amplitude of the sinusoidal current (the higher it is, the steeper the curve and the greater the error).
- ratio of switching frequency to electrical frequency (the smaller the ratio, the greater the error).

Figure 5:
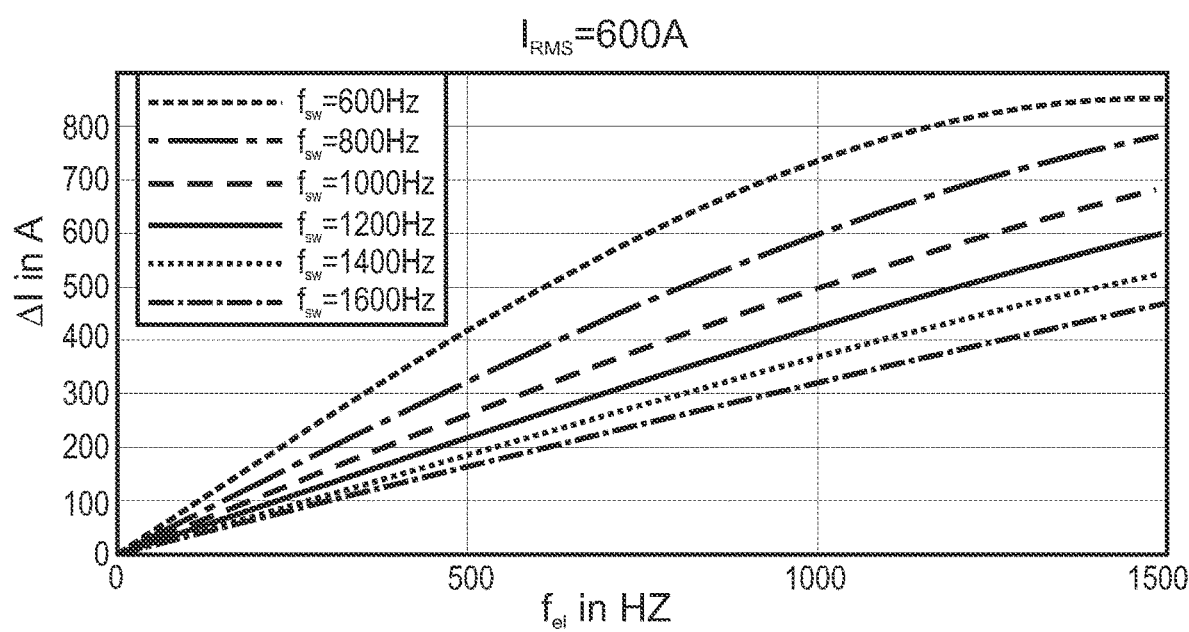
FIG. 5 shows the dependence of the current error on the switching frequency and electrical frequency.

The dependence of the current error on the switching frequency f_sw and the electrical frequency f_el is illustrated in FIG. 5 for an RMS value of 600 A. The lower the switching frequency f_sw is, the higher the current error ΔI is.

The maximum error in the latter case (ratio of switching frequency to electrical frequency) is always the amplitude. This maximum error results when the current jumps to the maximum current within a switching frequency. A higher switching frequency reduces the current error but has disadvantages in respect of the efficiency.

A large current error ΔI in this case has a plurality of disadvantages:

- The gate resistances of the power semiconductors 10, 20 need to be designed for a higher current, which brings with it disadvantages in terms of efficiency.
- The power loss split between the power semiconductors 10, 20 (MOSFET 10 and IGBT 20 in the figures) shifts and can result in an overload of one of the semiconductor types.

In addition, owing to propagation times within the closed-loop control, a further shift may arise, with the result that the current error ΔI is further increased.

Figure 4:
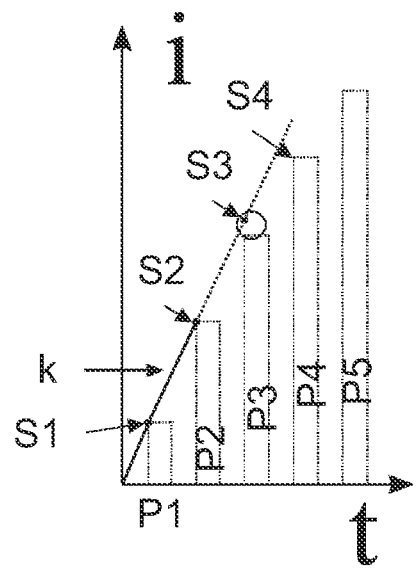
FIG. 4 shows a u-i graph with discretized current and the principle of predictive closed-loop control by means of linear extrapolation in accordance with one embodiment of the present invention.

As a solution, therefore, a pointwise interpolation of the discretized phase current which can be determined precisely by means of a phase current sensor is proposed, as indicated in FIG. 4.

The topological semiconductor switch 100 is split into at least two groups of power semiconductors 10, 20 (also semiconductor groups below, for short) which are driven temporally separately from one another at a preset switching frequency in such a way that in each case only one of the power semiconductors 10, 20 takes on the total current.

For determination of a next switching point S3, a pointwise interpolation of the discretized phase current takes place. For this purpose, the change in the current is measured and extrapolated between two conducting phases P1, P2 (conducting phase=switched-on state of a topological switch. At the known switching frequency (this is preset for the application), the current rise and the current error ΔI can then be predicted (and then also implemented) for the next two switching operations (switching points) S3, S4.

For example, in the case of a linear extrapolation, the rate of rise k of the straight line between the two switching points S1 and S2 is determined. Together with the known switching frequency (distance between the current columns in FIG. 4), the next switching point S3 with the smallest absolute current deviation results. The closer the determined switching point S3 is to the next-possible switchover point (i.e. to the next current column), the smaller the current error ΔI is. For the subsequent switching point S4, this can then in turn be taken as a reference for the prediction in order to arrive even closer at the optimum switchover time.

Since the linear extrapolation, as is illustrated in FIG. 4, has a certain deviation from the actual value, instead of a linear extrapolation it is also possible for the extrapolation to take place on the basis of a sine-wave modulation.

A short-term increase in the switching frequency can also take place in order to meet the switchover time (in this case switching point S3 or S4) more precisely.

The switching points S1-S4 can be at the start, end or be mid-synchronous with respect to the conducting phase P1-P5. Alternatively, an averaging between switching points S1-S4 can also take place.

By virtue of the proposed method for driving a topological semiconductor switch for a power electronics system, the switchover time when using hybrid semiconductor switches, i.e. semiconductor switches which are formed from at least two groups of power semiconductors, can be determined more precisely. Groups of power semiconductors 10, 20 should be understood to mean that the power semiconductors 10, 20 used can have different properties, i.e. can consist of different materials such as Si, SiC, GaN, etc. and/or can comprise different types such as MOSFET, IGBT, JFET, etc. and/or have different areas.

A power electronics module within the scope of this invention is used for operating an electric motor of a motor vehicle driven by means of a rechargeable battery fuel cell. The motor vehicle is in particular a utility vehicle such as an HGV or a bus, or a passenger car. The power electronics module comprises an inverter. It can also comprise a rectifier, a DC/DC converter, a transformer and/or another electrical converter or a part of such a converter or some of them. In particular, the power electronics module is used for supplying current to an electric machine, for example an electric motor and/or a generator. An inverter is preferably used to generate a polyphase alternating current from a direct current generated by means of a DC voltage of an energy source, for example a battery. A DC/DC converter is used, for example, to convert (step up) a direct current coming from a fuel cell into a direct current which can be used by the drive.

DC/DC converters and inverters for electric drives of vehicles, in particular passenger vehicles and utility vehicles, as well as buses, are designed for the high-voltage range and are in particular designed in a blocking voltage class of above approximately 650 volts.

The described inverter arrangement is used, for example, in motor vehicles. The motor vehicle can have in particular an electrically driven axle. The motor vehicle can in principle be in the form of a purely internal combustion engine-based motor vehicle, a hybrid motor vehicle or an electric vehicle.

LIST OF REFERENCE SIGNS

S1-S4 switching points
P1-P5 conducting phases k rate of rise
ΔI current error
i current
t time
f_el electrical frequency
f_sw switching frequency
100 semiconductor switch
10 MOSFET
20 IGBT

The invention claimed is:

1. A method for driving a topological semiconductor switch for a power electronics system for a motor vehicle, wherein
the topological semiconductor switch is split into at least two groups of power semiconductors that are driven temporally separately from one another at a preset switching frequency in such a way that in each case only one of the power semiconductors takes on a total current,
and wherein the method comprises:
determining a next switching point for the topological semiconductor switch, comprising:
conducting a pointwise interpolation of a discretized phase current in such a way that a change in current between two conducting phases of the topological semiconductor switch is measured and extrapolated, and then, together with a switching frequency, a current rise and a current error are predicted for a next two switching operations, and from this, the next switching point with a smallest absolute current deviation is determined.

2. The method according to claim 1, wherein the extrapolation is a linear extrapolation.

3. The method according to claim 1, wherein the extrapolation takes place on a basis of a sine-wave modulation.

4. The method according to claim 1, wherein the change in the current is measured at preset switching points.

5. The method according to claim 4, wherein the preset switching points are at a start or at an end or are mid-synchronous with respect to the two conducting phases.

6. The method according to claim 4, wherein averaging between two switching points takes place.

7. The method according to claim 1, wherein a short-term increase in the switching frequency takes place after determining the next switching point for switchover.

8. A power electronics module for a motor vehicle, comprising:
at least one topological semiconductor switch which is split into at least two groups of power semiconductors which are driven temporally separately from one another at a preset switching frequency in such a way that in each case only one of the power semiconductors takes on a total current, wherein the topological semiconductor switch is configured such that a next switching point is determined by conducting a pointwise interpolation of a discretized phase current in such a way that a change in current between two conducting phases is measured and extrapolated, and then, together with a switching frequency, a current rise and a current error are predicted for a next two switching operations, and from this, the next switching point with a smallest absolute current deviation is determined.

9. The power electronics module according to claim 8, wherein the power semiconductors in the groups comprise different semiconductor materials and/or different semiconductor types and/or different semiconductor areas.

10. The power electronics module according to claim 9, wherein one of the power semiconductors is an SiC-MOSFET and the other is an Si-IGBT.

11. An inverter, comprising the power electronics module according to claim 8.

12. An electric drive of a vehicle comprising the inverter according to claim 11.

13. A motor vehicle comprising an electric motor driven by the electric drive according to claim 12.

* * * * *